(12) United States Patent
Sugawara et al.

(10) Patent No.: US 11,482,645 B2
(45) Date of Patent: Oct. 25, 2022

(54) SEMICONDUCTOR LIGHT-EMITTING DEVICE (71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hideto Sugawara, Nonoichi Ishikawa (JP); Takanobu Kamakura, Yokosuka Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 60 days.

(21) Appl. No.: 17/176,758

(22) Filed: Feb. 16, 2021

(65) Prior Publication Data
US 2022/0085241 A1 Mar. 17, 2022

(30) Foreign Application Priority Data
Sep. 14, 2020 (JP) .............................. JP2020-153978

(51) Int. Cl.
*H01L 33/30* (2010.01)
*H01L 33/02* (2010.01)

(52) U.S. Cl.
CPC .......... *H01L 33/305* (2013.01); *H01L 33/025* (2013.01)

(58) Field of Classification Search
CPC ........................ H01L 33/025; H01L 33/305
See application file for complete search history.

(56) References Cited

U.S. PATENT DOCUMENTS 7,652,281 B2 1/2010 Takahashi et al.
2007/0045651 A1* 3/2007 Suzuki .................... H01L 33/02
257/97

(Continued)

FOREIGN PATENT DOCUMENTS

JP H11-068235 3/1999
JP 2002335007 A 11/2002

(Continued)

OTHER PUBLICATIONS

Van Deelen, et al., "Parameter study of intrinsic carbon doping", Journal of Crystal Growth 271 (2004), pp. 376-384.

*Primary Examiner* — Mark W Tornow
(74) *Attorney, Agent, or Firm* — Kim & Stewart LLP (57) ABSTRACT

A semiconductor light-emitting device includes first and second semiconductor layers and a light-emitting layer provided between the first semiconductor layer and the second semiconductor layer. The first semiconductor layer includes a compound semiconductor represented by a compositional formula $Al_XGa_{1-X}As$ (0<X<1). The first semiconductor layer has an n-type conductivity and includes a first impurity of the n-type. The first layer further includes carbon with a lower concentration than a concentration of the first impurity, and oxygen with a lower concentration than the concentration of the first impurity. The second semiconductor layer includes a compound semiconductor represented by a compositional formula $AlYGa1-YAs$ (0<Y<1). The second semiconductor layer has a p-type conductivity and including a second impurity of the p-type. The second semiconductor layer further includes carbon with a concentration substantially equal to the carbon concentration in the first semiconductor layer.

12 Claims, 5 Drawing Sheets

(56) References Cited

U.S. PATENT DOCUMENTS

| | | | |
|---|---|---|---|
| 2007/0075327 A1* | 4/2007 | Arai | H01L 33/14 257/103 |
| 2008/0121909 A1* | 5/2008 | Niigaki | H01L 33/30 257/E31.022 |
| 2009/0078966 A1* | 3/2009 | Asai | H01L 29/7783 257/690 |
| 2015/0214427 A1* | 7/2015 | Fuhrmann | H01L 33/30 257/13 |
| 2018/0198021 A1* | 7/2018 | Fuhrmann | H01L 33/06 |
| 2018/0261717 A1* | 9/2018 | Rudolph | H01L 33/305 |
| 2021/0091267 A1* | 3/2021 | Koslow | H01L 31/03042 |

FOREIGN PATENT DOCUMENTS

| | | |
|---|---|---|
| JP | 3937290 B2 | 6/2007 |
| JP | 2008091789 A | 4/2008 |

* cited by examiner

SEMICONDUCTOR LIGHT-EMITTING DEVICE

CROSS-REFERENCE TO RELATED APPLICATIONS

This application is based upon and claims the benefit of priority from Japanese Patent Application No. 2020-153978, filed on Sep. 14, 2020; the entire contents of which are incorporated herein by reference.

FIELD

Embodiments relate to a semiconductor light-emitting device.

BACKGROUND

In a semiconductor light-emitting device including an AlGaAs or the related mixed crystal semiconductor material, it is desirable to reduce the oxygen (O) and the carbon (C) included in the AlGaAs to improve the light emission characteristics. When the AlGaAs-based mixed crystal is grown, for example, using MOCVD (Metal Organic Chemical Vapor Deposition), growth conditions are selected to reduce the amounts of oxygen and carbon incorporated into the AlGaAs. However, the semiconductor light-emitting device includes multiple semiconductor layers having different compositions; and the growth conditions that reduce the oxygen and the carbon incorporated into the AlGaAs are not always suited to each semiconductor layer in the view of improving the crystal quality and reducing the manufacturing cost.

DETAILED DESCRIPTION

According to one embodiment, a semiconductor light-emitting device includes first and second semiconductor layers and a light-emitting layer provided between the first semiconductor layer and the second semiconductor layer. The first semiconductor layer includes a compound semiconductor represented by a compositional formula $Al_XGa_{1-X}As$ ($0<X<1$). The first semiconductor layer has an n-type conductivity and includes a first impurity of the n-type. The first layer further includes carbon with a lower concentration than a concentration of the first impurity, and oxygen with a lower concentration than the concentration of the first impurity. The second semiconductor layer includes a compound semiconductor represented by a compositional formula $Al_YGa_{1-Y}As$ ($0<Y<1$). The second semiconductor layer has a p-type conductivity and including a second impurity of the p-type. The second semiconductor layer further includes carbon with a concentration substantially equal to the carbon concentration in the first semiconductor layer.

Embodiments will now be described with reference to the drawings. The same portions inside the drawings are marked with the same numerals; a detailed description is omitted as appropriate; and the different portions are described. The drawings are schematic and conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

First Embodiment

Figure 1:
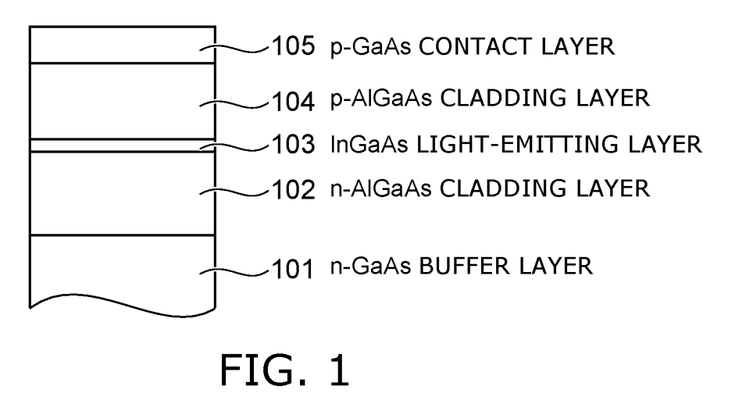
FIG. 1 is a schematic cross-sectional view of a semiconductor light-emitting device 1 according to a first embodiment.

FIG. 1 is a schematic cross-sectional view of a semiconductor light-emitting device 1 according to a first embodiment. The semiconductor light-emitting device 1 is, for example, a light-emitting diode. The n-side electrode and the p-side electrode are not illustrated in FIG. 1.

As shown in FIG. 1, the semiconductor light-emitting device 1 includes an n-type first semiconductor layer (hereinbelow, an n-type cladding layer 102), a light-emitting layer 103, and a p-type second semiconductor layer (hereinbelow, a p-type cladding layer 104). The light-emitting layer 103 is provided between the n-type cladding layer 102 and the p-type cladding layer 104.

The n-type cladding layer 102 and the p-type cladding layer 104 include compound semiconductors having a compositional formula $Al_XGa_{1-X}As$ ($0<X<1$) and $Al_YGa_{1-Y}As$ ($0<Y<1$), respectively, (hereinbelow, AlGaAs). The light-emitting layer 103 includes a compound semiconductor represented by $In_ZGa_{1-Z}As$ ($0<Z<1$) (hereinbelow, InGaAs).

The n-type cladding layer 102, the light-emitting layer 103, and the p-type cladding layer 104 are stacked in order on a semiconductor substrate (not-illustrated), e.g., a compound semiconductor substrate including GaAs (hereinbelow, a GaAs substrate).

An n-type buffer layer 101 is provided between the GaAs substrate and the n-type cladding layer 102. The n-type buffer layer 101 includes GaAs. A p-type contact layer 105 is provided on the p-type cladding layer 104.

The n-type buffer layer 101 and the n-type cladding layer 102 each include an n-type impurity, e.g., silicon (Si) or germanium (Ge). The p-type cladding layer 104 and the p-type contact layer 105 include a p-type impurity, e.g., at least one of beryllium (Be), magnesium (Mg) and zinc (Zn).

When a forward voltage is applied between p-side and n-side electrodes (not-illustrated), electrons and holes are injected into the light-emitting layer 103 from the n-type cladding layer 102 and the p-type cladding layer 104, respectively, and the semiconductor light-emitting device 1 radiates light due to recombination of the injected electrons and holes.

For example, the semiconductor layers shown in FIG. 1 are formed on a GaAs substrate (not-illustrated) by MOCVD. An organic metal raw material that includes a Group III element (hereinbelow, a Group III raw material) and a hydride raw material that includes a Group V element (a Group V raw material) are used in the MOCVD. The Group III raw material is, for example, trimethylgallium $(CH_3)_3Ga$, (Hereinbelow, TMG), trimethylindium $(CH_3)_3In$ (Hereinbelow, TMI) and/or trimethylaluminum $(CH_3)_3Al$, (Hereinbelow, TMA). The Group V raw material is, for example, arsine $(AsH_3)$.

It is known that carbon (C) is incorporated into the crystal from organic metals in the process of growing a compound semiconductor crystal using MOCVD. For example, $CH_3$ is produced by thermal decomposition of the TMG supplied as a source gas. Nearly all of the $CH_3$ forms stable methane ($CH_4$) by binding to the H due to the thermal decomposition of the Group V raw material and is removed outside the growth crystal. However, some methyl groups ($CH_3$) are incorporated into the crystal, because Ga and hydrogen (H) bond is not broken. Such methyl groups ($CH_3$) determine the carbon concentration in the crystal as a residual impurity. Thus, the amount of the Group III raw material, the amount of the Group V raw material, the heat amount while reacting, etc., are related to the incorporation of carbon into the growth crystal.

For example, the carbon concentration in AlGaAs or the related mixed crystal is dependent on parameters such as the amount of the Group III raw material that relates to the growth rate, the amount of the Group V raw material that is one basic condition of MOCVD represented by the V/III ratio with respect to the Group III raw material amount, the growth temperature, the Al mole fraction (the Al amount in the crystal), the plane orientation of the substrate crystal on which the crystal growth is performed), and like. For example, Van Deelen et al., "Parameter study of intrinsic carbon doping of $Al_xGa_{1-x}As$ by MOCVD, Journal of Crystal Growth", 271 (3-4), pp. 376-384 (2004) is incorporated herein as a reference.

Carbon (C) is an impurity that may become an acceptor in a Group III-V compound semiconductor. For example, by lowering the carbon concentration in the crystal as much as possible, the conductivity can be controlled by the other impurities intentionally-doped. Thus, the parameters described above are generally set to reduce the carbon concentration.

Also, trace oxygen (O) that cannot be removed in the purification process is included in the raw materials described above and in the carrier gases for supplying the raw materials to the processing point of the process. Therefore, the oxygen (O) is also incorporated into the growth crystal in the MOCVD growth. In particular, the incorporated amount of oxygen is increased in AlGaAs and the related mixed crystals that include aluminum (Al), because aluminum is strongly bonded with oxygen (O). Accordingly, the procedure for suppressing the incorporation of oxygen (O) is also used such as selecting the growth conditions.

However, selecting the parameters described above to achieve the lower concentrations of carbon and oxygen may not be desirable in the view of the productivity of the semiconductor light-emitting device. For example, MOCVD has the feature of non-equilibrium growth in which much of the Group V raw material is supplied with respect to the Group III raw material. Therefore, the Group V raw material includes the Group V elements incorporated into the crystal and also includes other Group V elements not contribute to the crystal growth, resulting in the low usage efficiency of the raw material. Thus, in the view of the productivity, it is desirable to reduce the ineffective rate of the Group V raw material by reduce the supply amount of the Group V raw material, i.e., by reducing the V/III ratio. As a result, the carbon that is exhausted as methane ($CH_4$) is decreased, and the carbon concentration in the crystal is undesirably increased.

It is desirable for the $Al_xGa_{1-x}As$ mixed crystals used as the cladding layers of the semiconductor light-emitting device to have the large bandgap by increasing the composition ratio X of Al, which provides effective carrier confinement in the light-emitting layer. In TMA, which is the Al raw material, the bond of Al and $CH_3$ is relatively strong. Also, the bond of Al and oxygen (O) is strong. Thus, Al has the property of increasing these impurity elements in the crystal that are incorporated undesirably.

When the light-emitting layer includes an InGaAs or the related mixed crystal, the optimal growth temperature of the InGaAs or the related mixed crystal is less than that of the AlGaAs and related mixed crystals. For example, when the light-emitting layer and the cladding layers are continuously grown, the growth conditions are selected which are suited to the active layer that determines the light emission characteristics. Therefore, the growth temperature of the AlGaAs mixed crystal is undesirably less than the optimal growth temperature thereof. This also makes the carbon (C) and oxygen (O) concentrations increase in the crystal. Thus, the incorporation of carbon (C) and oxygen (O) into the AlGaAs or related mixed crystal causes the confliction between the view of the productivity and/or the structure design and the view of the device characteristics and/or the conductivity control in the semiconductor layers, and the semiconductor light-emitting device is considered to be designed under the appropriate balance thereof.

According to diligent experiments by the inventor of the application, it was found that 1) the carbon atoms occupy the vacancies of Group V atoms that have a relatively high vapor pressure, 2) the carbon atoms compensates the deep-level doners formed by the oxygen atoms, and 3) the existence of carbon (C) suppresses the incorporation of oxygen (O), because the Group V vacancy is occupied by one of the carbon atom and the oxygen atom, and the carbon (C) provides more precise atomic arrangement of the entire crystal, and is beneficial for the control of the conductivity. In other words, it was found that the crystal quality of the AlGaAs mixed crystal can be improved by the carbon (C) in the crystal that has a higher concentration than that of oxygen (O).

The semiconductor light-emitting device 1 according to the embodiment includes the n-type cladding layer 102 and the p-type cladding layer 104 that include AlGaAs mixed crystals; and the crystal growth conditions, under which oxygen (O) and carbon (C) are incorporated into the crystals, are employed in the manufacturing processes of the n-type and p-type cladding layers 102 and 104 to improve the crystal quality of the AlGaAs layers. In the semiconductor light-emitting device 1, the light emission characteristics and the reliability can be improved, whereas the n-type and p-type cladding layers 102 and 104 include high concentrations of carbon (C).

The n-type cladding layer 102 and the p-type cladding layer 104 shown in FIG. 1 include, for example, AlGaAs having an Al mole fraction of 0.5 (X=0.5). The n-type cladding layer 102 includes silicon (Si) as an n-type impurity, and the p-type cladding layer 104 includes zinc (Zn) as a p-type impurity. These impurities are doped for conductivity control in the MOCVD crystal growth process.

The MOCVD growth parameters are as follows.
Growth temperature: 720° C.
Growth rate: 3 μm/h
V/III ratio: 20

Here, to maintain the steepness of the interface between the light-emitting layer 103 and each cladding layer, the n-type cladding layer 102, the light-emitting layer 103, and the p-type cladding layer 104 are continuously grown without interrupting the growth to modify the growth temperature of each layer, etc.

Figure 2A:
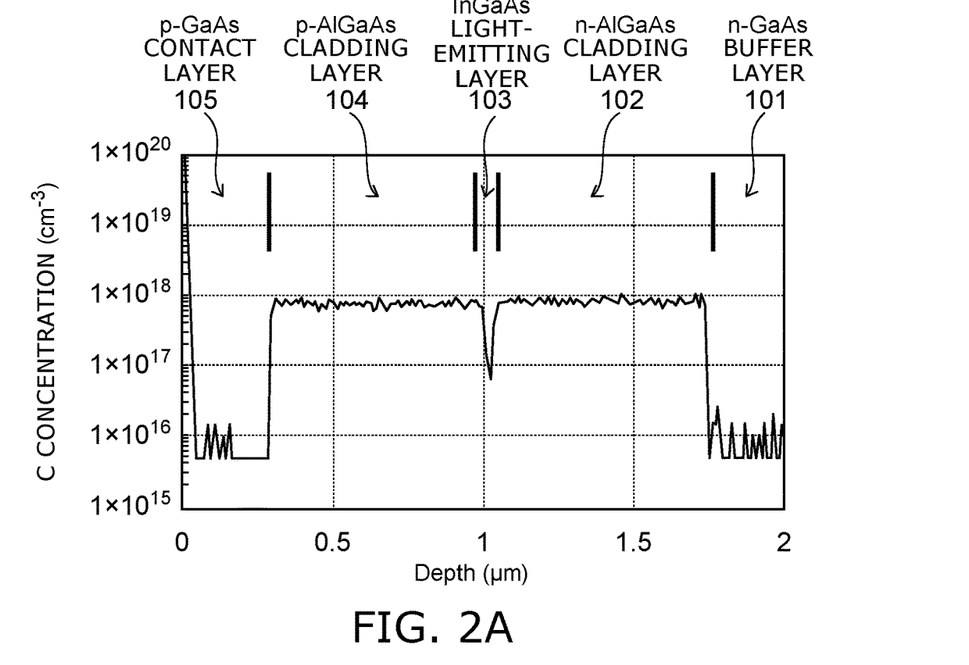
FIGS. 2A and 2B are concentration profiles of carbon and oxygen in the semiconductor layers shown in FIG. 1.
Figure 2B:
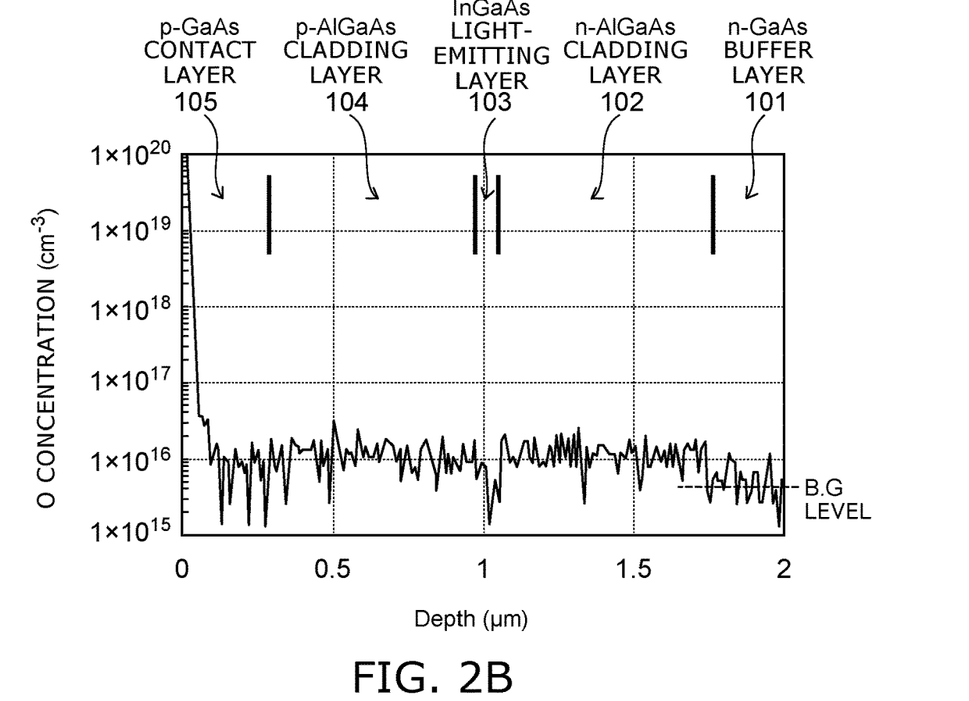

FIGS. 2A and 2B are concentration profiles of carbon and oxygen in the semiconductor layers shown in FIG. 1. FIGS. 2A and 2B show a carbon concentration profile and an oxygen concentration profile of SIMS (Secondary Ion Mass Spectroscopy) analysis. The horizontal axis is the depth (μm) from the surface of the p-type contact layer 105, and the vertical axes are the carbon and oxygen concentrations ($cm^{-3}$).

As shown in FIG. 2A, the carbon concentrations of the n-type and p-type cladding layers 102 and 104 both are about $7 \times 10^{17}$ $cm^{-3}$. In other words, the carbon concentrations of the n-type and p-type cladding layers 102 and 104 are substantially equal.

As shown in FIG. 2B, the oxygen concentrations of the n-type and p-type cladding layers 102 and 104 both are about $1 \times 10^{16}$ $cm^{-3}$. The oxygen concentrations of the n-type and p-type cladding layers 102 and 104 are also substantially equal.

Here, "substantially equal" means that, for example, the concentrations of the elements overlap in the error range of the measurement of the concentration profile. For example, it is known that the concentration of SIMS analysis includes a relative error of about 10% such as a standard deviation of the measurement values. That is, the SIMS data may include the measurement error of about 10%.

Thus, for the crystal growth conditions according to the embodiment, it can be seen that both carbon (C) and oxygen (O) are included in the AlGaAs, and that carbon (C) is the dominant concentration. It is estimated thereby that carbon (C) and oxygen (O) occupy the Group V vacancies with a high ratio, and the carbon (C) that acts as acceptors compensate the deep-level donors of oxygen (O).

With respect to the impurity concentrations of carbon (C) and oxygen (O) in the n-type cladding layer 102, silicon (Si) is doped with a concentration of $2.3 \times 10^{18}$ $cm^{-3}$ to control the conductivity thereof. Zinc (Zn) is doped in the p-type cladding layer 104 with a concentration of $3.0 \times 10^{17}$ $cm^{-3}$ to control the conductivity thereof. The silicon concentration is set to be greater than the carbon concentration in the n-type cladding layer 102, and thus, the conductivity thereof is controlled by the intentionally-doped impurities.

Figure 3:
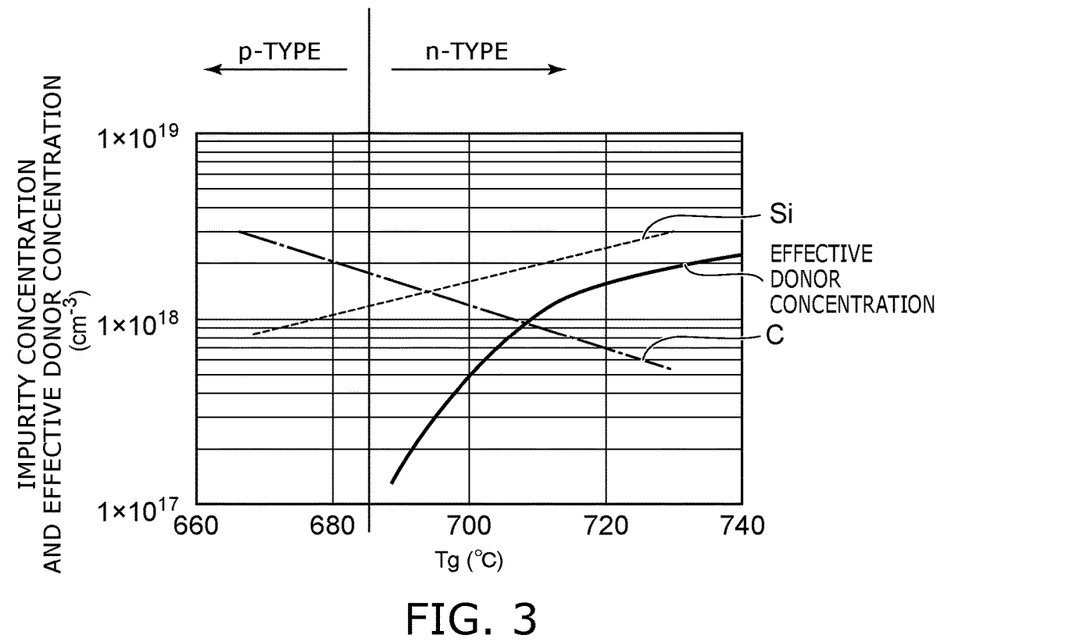
FIG. 3 is a graph showing the growth temperature dependence of the impurity concentrations of AlGaAs.

FIG. 3 is a graph showing the growth temperature dependence of the impurity concentrations of AlGaAs. FIG. 3 shows the growth temperature dependence of the impurity concentrations and the effective donor concentration in the n-type cladding layer 102. The horizontal axis is a growth temperature Tg (° C.), and the vertical axis is the concentration ($cm^{-3}$). The supply amount of the silicon (Si) raw material is constant. It should be noted that not all of the silicon and carbon atoms in the crystal act as donors or acceptors.

As shown in FIG. 3, as the growth temperature Tg increases, the silicon concentration increases, and the carbon concentration decreases. The effective donor concentration in the crystal is determined by a relationship between the donor concentration of silicon and the acceptor concentration of carbon. For example, when the growth temperature Tg is 720° C., the silicon concentration is $2.3 \times 10^{18}$ $cm^{-3}$, and the carbon concentration is $7.0 \times 10^{17}$ $cm^{-3}$. Because the silicon concentration is greater than the carbon concentration, the silicon donors are dominant, and the effective donor concentration is the n-type of $1.6 \times 10^{18}$ $cm^{-3}$. When the growth temperature Tg is 680° C., the carbon concentration is $2.0 \times 10^{18}$ $cm^{-3}$ and is greater than the silicon concentration. Therefore, the carbon acceptors become dominant, and the conductivity of the crystal inverts to the p-type. Thus, silicon is intentionally doped to achieve the desired conductivity in the crystal with respect to the carbon concentration, which is dependent on the growth temperature Tg.

The structure of the semiconductor layer according to the embodiment differs from conventional art in that the n-type cladding layer 102 and the p-type cladding layer 104 include oxygen (O) and carbon (C); the carbon concentration is relatively high; and the n-type cladding layer 102 and the p-type cladding layer 104 have substantially the same carbon concentration. In other words, by setting the carbon concentration in the crystal to a relatively high level, the Group V vacancies of the n-type and p-type cladding layers 102 and 104 are occupied so that the oxygen concentration is suppressed; and thereby, the crystal quality can be improved.

The crystal growth by MOCVD is performed on the premise that the incorporation of oxygen into the crystal is suppressed by setting the vacuum degree in the crystal growth chamber to be not more than the prescribed level, and by purifying the source gases to be not less than the prescribed level. According to the embodiment, even under such conditions, the oxygen concentration that is incorporated into the crystal can be optimized by the crystal growth conditions.

In the semiconductor light-emitting device 1 according to the embodiment, for example, the Group V vacancies can be reduced, and the deep levels due to the oxygen atoms are reduced. Thus, the non-radiative recombination via the deep levels is suppressed, and the light emission characteristics are improved. Furthermore, by suppressing the Group V vacancies, the diffusion of the silicon of the n-type cladding layer 102 and the zinc of the p-type cladding layer 104 into the light-emitting layer 103 can be prevented. Thereby, the steepness of the interfaces can be ensured between the light-emitting layer and the two cladding layers, and excellent device characteristics can be realized In the lattice-mismatched heterostructure according to the embodiment (i.e., AlGaAs/InGaAs/AlGaAs), the oxygen in the AlGaAs also affects the crystal hardness. For example, lowering the crystal hardness by reducing the oxygen concentration may improve the resistance to crystal distortion. The suppression of the oxygen concentration in the AlGaAs also causes the suppression of strain applied to the light-emitting layer 103, and provides excellent device characteristics.

Second Embodiment

Figure 4A:
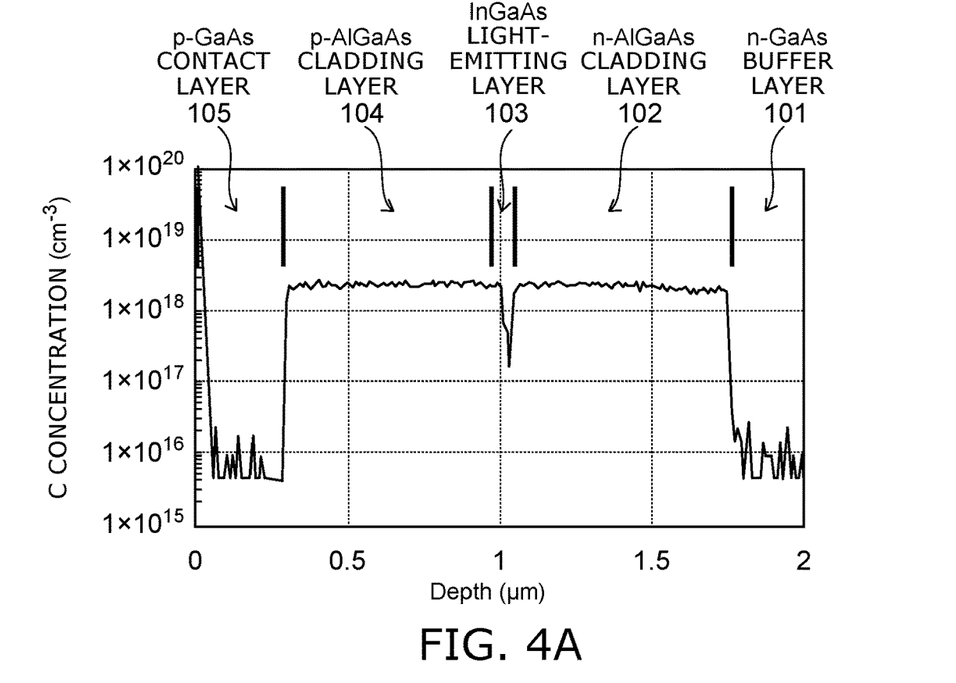
FIGS. 4A and 4B are concentration profiles of carbon and oxygen of semiconductor layers of a semiconductor light-emitting device according to a second embodiment.
Figure 4B:
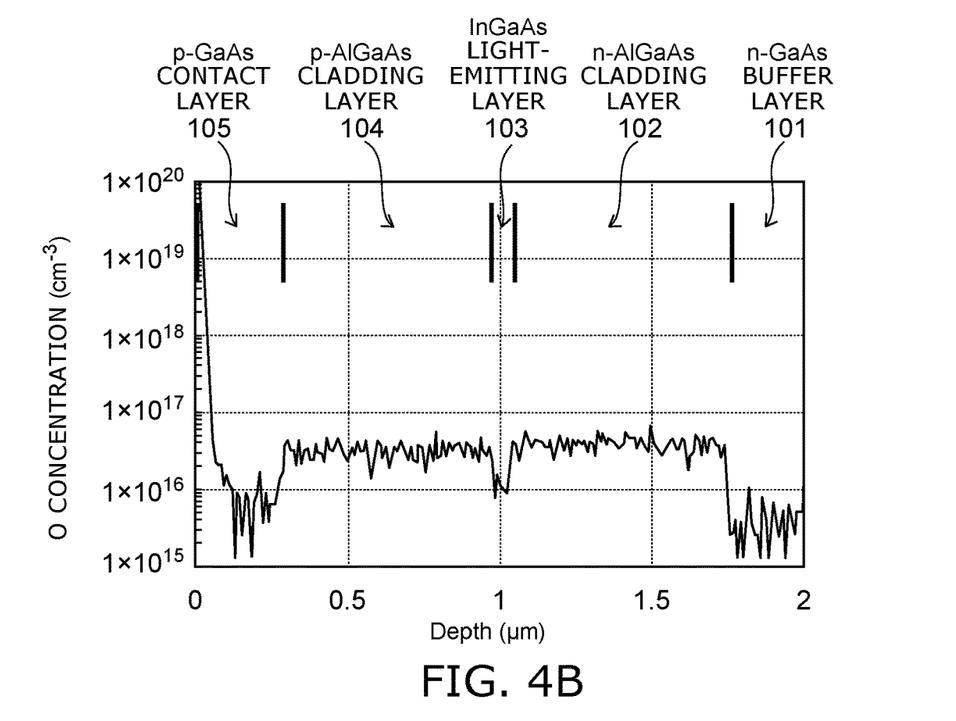

FIGS. 4A and 4B are concentration profiles of carbon and oxygen in the semiconductor layers of the semiconductor light-emitting device according to the second embodiment. FIGS. 4A and 4B respectively show a carbon concentration profile and an oxygen concentration profile of SIMS analysis. The horizontal axis is the depth (μm) from the surface of the p-type contact layer 105, and the vertical axes are the carbon and oxygen concentrations ($cm^{-3}$).

In the example, the crystal growth is performed by MOCVD with a growth temperature Tg of 680° C. Lowering the growth temperature Tg from 720° C. to 680° C. is preferable to improve the crystal quality of InGaAs in the light-emitting layer 103. The light emission characteristics can be improved thereby.

By reducing the growth temperature Tg as shown in FIGS. 4A and 4B, the carbon concentration becomes $2.0 \times 10^{18}$ $cm^{-3}$, and the oxygen concentration becomes $3.5 \times 10^{16}$ $cm^{-3}$. The carbon concentration and the oxygen concentration both increase. It is considered that the dissociation of the $CH_3$ in the Group III raw material of the growth no longer proceeds compared to the first embodiment due to the reduction of the temperature Tg, and TMA enhances the incorporation of carbon (C) because of the relatively high thermal decomposition temperature. Moreover, the desorption of oxygen adhered to the crystal surface is suppressed. Accordingly, the concentrations of the intentionally-doped impurities of silicon (Si) and zinc (Zn) are respectively $3.0\times10^{18}$ cm$^{-3}$ and $7.0\times10^{17}$ cm$^{-3}$. The doping amount of silicon in the n-type cladding layer 102 is increased to control the conductivity of the n-type cladding layer 102.

As shown in FIG. 4A, the carbon concentration is about $2.0\times10^{18}$ cm$^{-3}$ in the n-type and p-type cladding layers 102 and 104. For example, the carbon concentration in the n-type cladding layer 102 is substantially equal to the carbon concentration in the p-type cladding layer 104 at the vicinity of the light-emitting layer 103. Also, in the example, the carbon atoms occupy the Group V vacancies and act beneficially in the entire crystal. The semiconductor light-emitting device according to the embodiment exhibits the characteristics equivalent to those of the semiconductor light-emitting device 1.

In the case where zinc (Zn) is intentionally doped as the p-type impurity in the p-type cladding layer 104 and the Zn concentration is greater than $1.0\times10^{18}$ cm$^{-3}$, the zinc diffusion is pronounced because of the large diffusion coefficient of Zn. The interface between the p-type cladding layer 104 and the light-emitting layer 103 and/or the crystal quality of the InGaAs in the light-emitting layer 103 are degraded thereby, and the characteristics of the semiconductor light-emitting device degrade. Even if the desired acceptor concentration can be obtained by increasing the carbon concentration at the lower growth temperature Tg, there may be the lower limit of the growth temperature Tg under which the crystal quality is degraded. Therefore, the carbon concentration in the crystal may have an upper limit corresponding to the lower limit of the growth temperature Tg, and is preferably not more than $3.0\times10^{18}$ cm$^{-3}$. Thus, there may be the optimal conditions under which the desired acceptor concentration is obtained while avoiding the degradation of the crystal quality.

The embodiments are not limited to the examples described above; for example, the carbon concentration in the n-type cladding layer 102 may be substantially equal to the carbon concentration in the p-type cladding layer 104, and not more than $3.0\times10^{18}$ cm$^{-3}$.

Various modifications are applicable to the growth parameters that affect the carbon concentration. For example, it is also possible to appropriately modify the growth conditions of the n-type and p-type cladding layers 102 and 104.

For example, the crystal quality of the n-type cladding layer 102 can be improved by setting the growth temperature Tg of the n-type cladding layer 102 to be greater than the growth temperature Tg of the p-type cladding layer 104. The crystal quality also can be improved thereby in the light-emitting layer 103 grown on the n-type cladding layer 102. In such a case, the carbon and oxygen concentrations of the p-type cladding layer 104 are greater than the carbon and oxygen concentrations of the n-type cladding layer 102.

To obtain the desired carrier concentrations, the n-type cladding layer 102 is doped with silicon (Si), which is an n-type dopant, and the p-type cladding layer 104 is doped with zinc (Zn), which is a p-type dopant. Generally, the Si doping level of the n-type cladding layer 102 and the Zn doping level of the p-type cladding layer 104 are set to be greater than the carbon and oxygen concentrations. Thus, there may be a case where the Zn doped into the p-type cladding layer 104 diffuses into the light-emitting layer 103, and the light emission characteristics are degraded. Therefore, it is preferable to suppress the Zn diffusion into the light-emitting layer 103 by setting the carbon concentration in the p-type cladding layer 104 to be greater than the carbon concentration in the n-type cladding layer 102.

In contrast, it is also possible to set the growth temperature Tg of the p-type cladding layer 104 to be greater than the growth temperature Tg of the n-type cladding layer 102. In such a case, the carbon and oxygen concentrations of the n-type cladding layer 102 are greater than the carbon and oxygen concentrations of the p-type cladding layer 104. Such a concentration control is effective when the drive current density of the semiconductor light-emitting element is low, and the Zn is not easily diffused thereunder.

In any case described above, the relative ratio of the carbon concentration and the oxygen concentration is preferably equal in the n-type cladding layer 102 and the p-type cladding layer 104.

Third Embodiment

Figure 5:
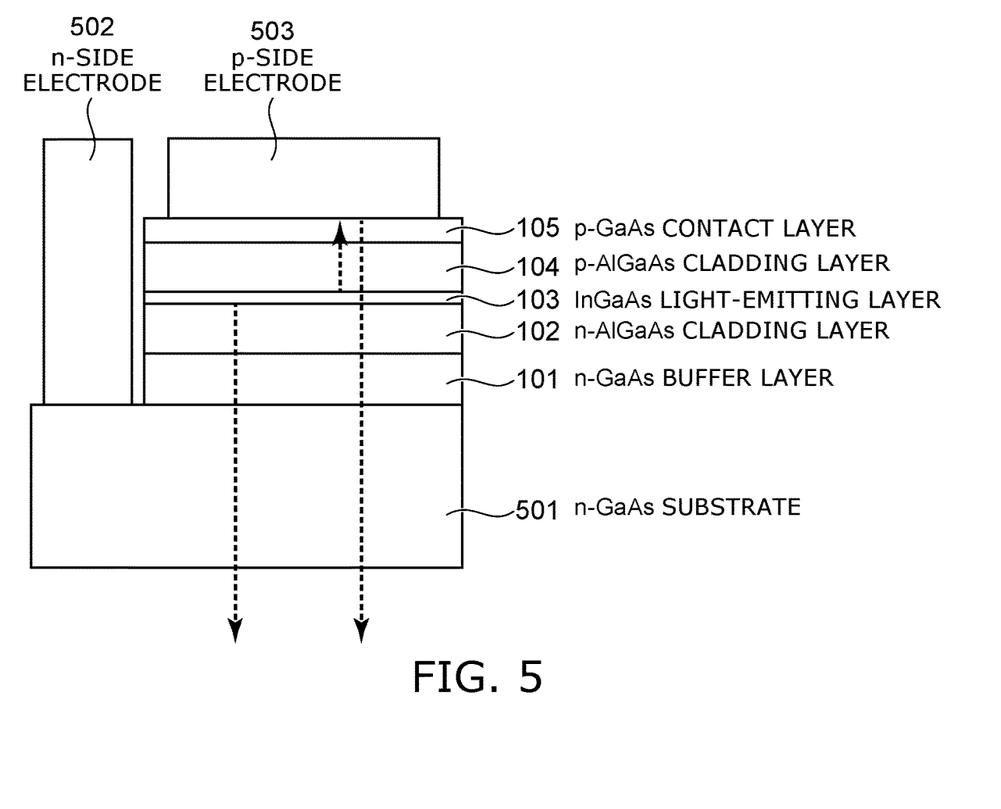
FIG. 5 is a schematic cross-sectional view showing a semiconductor light-emitting device 2 according to a third embodiment.

FIG. 5 is a schematic cross-sectional view showing a semiconductor light-emitting device 2 according to a third embodiment. The semiconductor light-emitting device 2 includes the semiconductor layers 101 to 105 described in the first and second embodiments.

The semiconductor light-emitting device 2 further includes an n-type GaAs substrate 501, an n-side electrode 502, and a p-side electrode 503.

For example, the n-type GaAs substrate 501 is used to epitaxially grow the n-type buffer layer 101, the n-type cladding layer 102, the light-emitting layer 103, the p-type cladding layer 104, and the p-type contact layer 105 in order by MOCVD.

When the semiconductor light-emitting device 2 emits light, a forward bias is applied between the n-side electrode 502 and the p-side electrode 503, and cause a drive current to flow between the n-side electrode 502 and the p-side electrode 503.

The p-side electrode 503 is formed at the entire surface of the p-type contact layer 105. Therefore, the drive current is uniformly supplied from the p-side electrode 503 to the entire surface of the p-type contact layer 105. Thereby, the light-emitting layer 103 uniformly emits light.

The light-emitting layer 103 includes, for example, a compound semiconductor mixed crystal having a compositional formula In$_{0.2}$Ga$_{0.8}$As, and emits light having a center wavelength of, for example, 950 nm. The light emitted from the light-emitting layer 103 is radiated from both the lower surface and the upper surface of the light-emitting layer 103. The light radiated from the lower surface is externally extracted via the n-type GaAs substrate 501. On the other hand, the light radiated from the upper surface propagates toward the p-side electrode, and is reflected at the interface between the p-type contact layer 105 and the p-side electrode 503. Further, the reflected light changes the propagation direction downward, and is externally extracted via the n-type GaAs substrate 501. That is, the semiconductor light-emitting device 2 is a backside-emitting device in which the light is extracted from the lower surface side. The arrows shown in FIG. 5 illustrate the propagation paths of the light radiated from the light-emitting layer 103.

The types and concentrations of the impurities doped into the n-type GaAs substrate 501, the n-type buffer layer 101, and the p-type contact layer 105 are as follows.

n-type GaAs substrate 501: silicon (Si), $1.0\times10^{18}$ cm$^{-3}$
n-type GaAs buffer layer 101: silicon (Si), $8.0\times10^{17}$ cm$^{-3}$
p-type GaAs contact layer 105: zinc (Zn), $2.0\times10^{18}$ cm$^{-3}$ The carbon and oxygen concentrations of these three layers are, for example, not more than the detection limit of SIMS analysis. In other words, in the semiconductor devices 1 and 2 according to the embodiments, carbon (C) and oxygen (O) exist in the light-emitting region, which has a relatively high Al composition.

As described in the first embodiment, the Si concentration of the n-type AlGaAs cladding layer 102 is $2.3 \times 10^{18}$ cm$^{-3}$ and is greater than those of the other layers. This is because the concentration of carbon (C) included in the n-type AlGaAs cladding layer 102 is relatively high.

For example, when the semiconductor light-emitting device 2 according to the embodiment is provided in a photocoupler with a light-receiving element, bonding wires (not illustrated) are connected respectively to the p-side and n-side electrodes 503 and 502. Also, for example, the semiconductor light-emitting device 2 is covered with a resin member (not illustrated).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light-emitting device, comprising:
   a first semiconductor layer including a compound semiconductor represented by a compositional formula $Al_XGa_{1-X}As$ (0<X<1), the first semiconductor layer having an n-type conductivity and including a first impurity of the n-type, the first semiconductor layer further including carbon with a lower concentration than a concentration of the first impurity, and oxygen with a lower concentration than the concentration of the first impurity;
   a second semiconductor layer including a compound semiconductor represented by a compositional formula $Al_YGa_{1-Y}As$ (0<Y<1), the second semiconductor layer having a p-type conductivity and including a second impurity of the p-type, the second semiconductor layer further including carbon with a concentration substantially equal to the carbon concentration in the first semiconductor layer; and
   a light-emitting layer provided between the first semiconductor layer and the second semiconductor layer.

2. The semiconductor light-emitting device according to claim 1, wherein
   the oxygen concentration in the first semiconductor layer is less than the carbon concentration in the first semiconductor layer.

3. The semiconductor light-emitting device according to claim 1, wherein
   the carbon concentration in the second semiconductor layer is not more than $3.0 \times 10^{18}$ cm$^{-3}$.

4. The semiconductor light-emitting device according to claim 1, wherein
   a second impurity concentration in the second semiconductor layer is less than the carbon concentration in the second semiconductor layer.

5. The semiconductor light-emitting device according to claim 1, wherein the second semiconductor layer further includes oxygen, and, in the first and second semiconductor layers, oxygen concentrations are less than the carbon concentrations.

6. The semiconductor light-emitting device according to claim 1, wherein
   the first impurity is silicon (Si) or germanium (Ge).

7. The semiconductor light-emitting device according to claim 1, wherein
   the second impurity is at least one of beryllium (Be), magnesium (Mg), and zinc (Zn).

8. The semiconductor light-emitting device according to claim 1, wherein
   the light-emitting layer includes a compound semiconductor represented by a compositional formula $In_ZGa_{1-Z}As$ (0<Z<1).

9. The semiconductor light-emitting device according to claim 1, further comprising:
   a semiconductor substrate including GaAs, the semiconductor substrate having the n-type conductivity, the first semiconductor layer being provided between the light-emitting layer and the semiconductor substrate; and
   a third semiconductor layer provided between the first semiconductor layer and the semiconductor substrate, the third semiconductor layer having the n-type conductivity and including a third impurity of the n-type, the third semiconductor layer further including carbon with a lower concentration than the carbon concentration of the first semiconductor layer, and oxygen with a lower concentration than the oxygen concentration of the first semiconductor layer.

10. The semiconductor light-emitting device according to claim 9, wherein
    the concentration of the first impurity in the first semiconductor layer is greater than a concentration of the third impurity in the third semiconductor layer.

11. The semiconductor light-emitting device according to claim 9, further comprising:
    a fourth semiconductor layer having the p-type conductivity and including a fourth impurity of the p-type, a concentration of the fourth impurity being higher than a concentration of the second impurity in the second semiconductor layer,
    the second semiconductor layer being provided between the light-emitting layer and the fourth semiconductor layer and further including oxygen,
    the fourth semiconductor layer including carbon with a lower concentration than the carbon concentration in the second semiconductor layer and including oxygen with a lower concentration than an oxygen concentration in the second semiconductor layer.

12. The semiconductor light-emitting device according to claim 11, wherein
    the third semiconductor layer and the fourth semiconductor layer are compound semiconductor layers including GaAs.

* * * * *